ns(12) United States Patent
Caimi et al.

(10) Patent No.: US 9,735,010 B1
(45) Date of Patent: Aug. 15, 2017

(54) FABRICATION OF SEMICONDUCTOR FIN STRUCTURES

(71) Applicant: International Business Machines Corporation, Armonk, NY (US)

(72) Inventors: Daniele Caimi, Besenbueren (CH); Lukas Czornomaz, Zurich (CH); Jean Fompeyrine, Waedenswil (CH); Emanuele Uccelli, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/166,645

(22) Filed: May 27, 2016

(51) Int. Cl.
H01L 29/00 (2006.01)
H01L 21/00 (2006.01)
(Continued)

(52) U.S. Cl.
CPC .. *H01L 21/02694* (2013.01); *H01L 21/02502* (2013.01); *H01L 21/02516* (2013.01);
(Continued)

(58) Field of Classification Search
CPC ......... H01L 21/76251; H01L 21/02502; H01L 21/02516; H01L 21/02546;
(Continued)

(56) References Cited

U.S. PATENT DOCUMENTS 4,948,456 A 8/1990 Schubert
8,084,337 B2 12/2011 Samuelson
(Continued)

FOREIGN PATENT DOCUMENTS

JP 2013535090 9/2013

OTHER PUBLICATIONS

Cantaro et al, "Heteroepitaxy of III-V Compound Semiconductors on Silicon for Logic Applications", 2012, ECS Transactions, 50(9) 349-355.*

(Continued)

*Primary Examiner* — Dale E Page
*Assistant Examiner* — Quovaunda V Jefferson
(74) *Attorney, Agent, or Firm* — Daniel P. Morris; Otterstedt, Ellenbogen & Kammer, LLP

(57) ABSTRACT

A semiconductor substrate is a provided and an insulating layer is formed thereon. A cavity structure is formed above the insulating layer, including a lateral growth channel and a fin seed structure arranged in the lateral growth channel. The fin seed structure provides a seed surface for growing a fin structure. One or more first semiconductor structures of a first semiconductor material and one or more second semiconductor structures of a second, different, semiconductor material are grown sequentially in the growth channel from the seed surface in an alternating way. The first semiconductor structures provide a seed surface for the second semiconductor structures and the second semiconductor structures provide a seed surface for the first semiconductor structures. The second semiconductor structures are selectively etched, thereby forming the fin structure comprising a plurality of parallel fins of the first semiconductor structures. Corresponding semiconductor structures are also included.

25 Claims, 18 Drawing Sheets

(51) Int. Cl.
*H01L 21/02* (2006.01)
*H01L 29/66* (2006.01)
*H01L 29/20* (2006.01)
*H01L 29/78* (2006.01)
*H01L 29/32* (2006.01)

(52) U.S. Cl.
CPC .. *H01L 21/02546* (2013.01); *H01L 21/02645* (2013.01); *H01L 29/20* (2013.01); *H01L 29/32* (2013.01); *H01L 29/66522* (2013.01); *H01L 29/66795* (2013.01); *H01L 29/7851* (2013.01)

(58) Field of Classification Search
CPC ... H01L 21/02645; H01L 29/20; H01L 29/32; H01L 29/66522; H01L 29/66795; H01L 29/7851
See application file for complete search history.

(56) References Cited

U.S. PATENT DOCUMENTS

| | | |
|---|---|---|
| 8,143,646 B2 | 3/2012 | Hudait |
| 8,173,551 B2 | 5/2012 | Bai et al. |
| 8,274,097 B2 | 9/2012 | Cheng |
| 8,384,196 B2 | 2/2013 | Hydrick |
| 2006/0131606 A1 | 6/2006 | Cheng |
| 2010/0261339 A1 | 10/2010 | Wunnicke |
| 2011/0086491 A1 | 4/2011 | Ko |
| 2011/0204378 A1 | 8/2011 | Su |
| 2011/0221039 A1 | 9/2011 | Singh et al. |
| 2011/0253982 A1 | 10/2011 | Wang |
| 2011/0306179 A1 | 12/2011 | Wann |
| 2012/0025195 A1 | 2/2012 | McComber |
| 2014/0091360 A1 | 4/2014 | Pillarisetty |
| 2015/0102454 A1* | 4/2015 | Cheng ................. H01L 27/0886 257/506 |

OTHER PUBLICATIONS

Allon I. Hochbaum et al. Controlled Growth of Si Nanowire Arrays for Device Integration. Nano Lett., vol. 5, No. 3, 2005 American Chemical Society Published on Web Jan. 26, 2005. pp. 457-460.

Mirco Cantoro et al. Heteroepitaxy of iii-v compound semiconductors on silicon for logic applications: selective area epitaxy in shallow trench isolation structures vs. direct epitaxy mediated by strain relaxed buffers. ECS Trans. 2013 vol. 50, Issue 9, pp. 349-355.

Semiconductor Today, Compounds & Advanced Silicon, Kyoung Jin Choi et al. First wafer-scale heteroepitaxial growl of iii-v nanowires on silicon. Jun. 11, 2013. pp. 1-3.

Schubert, P.J et al. Confined lateral selective epitaxial growth of silicon for device fabrication. IEEE Electron Device Letters (vol. 11, Issue: 5 ). pp. 181-183 May 1990 Abstract Only, Abstract p. 1-2.

N.D. Nguyen et al., Selective epitaxial growth of III-V semiconductor heterostructures on Si substrates for logic applications. ECS Transactions 33(6) 2010 pp. 933-939.

Jae Cheol Shin et al., Wafer-Scale Production of Uniform InAsyP1y Nanowire Array on Silicon for Heterogeneous Integration, ACS Nano vol. 7, No. 6, pp. 5463-5471, 2013.

Daniele Caimi et al., unpublished U.S. Appl. No. 15/166,825, filed May 27, 2016, Fabrication of Compound Semiconductor Structures, pp. 1-32 plus 13 sheets drawings.

List of IBM Patents or Patent Applications Treated as Related.

Schubert, P.J et al. Confined Lateral Selective Epitaxial Growth of Silicon for Device Fabrication. IEEE Electron Device Letters (vol. 11, Issue: 5). pp. 181-183 May 1990 complete paper.

* cited by examiner

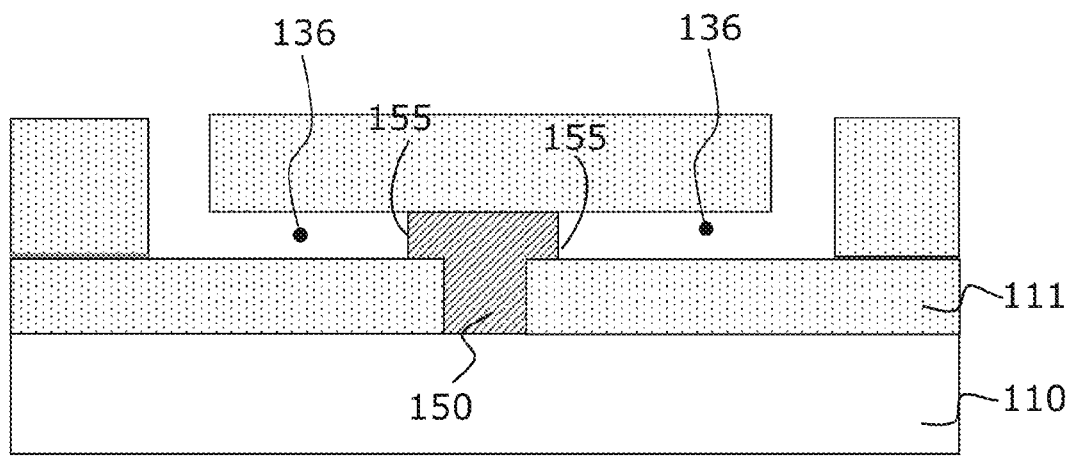
FIG. 9      900
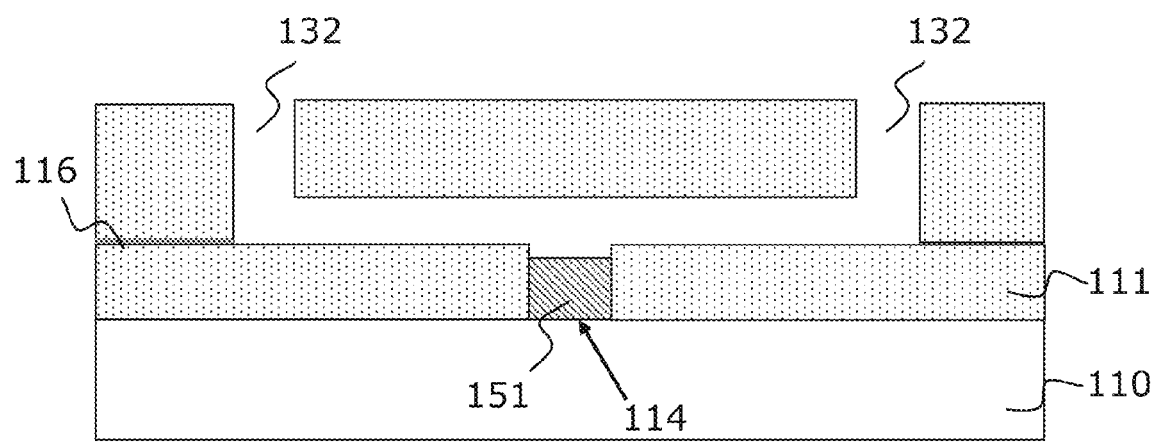
FIG. 10      1000

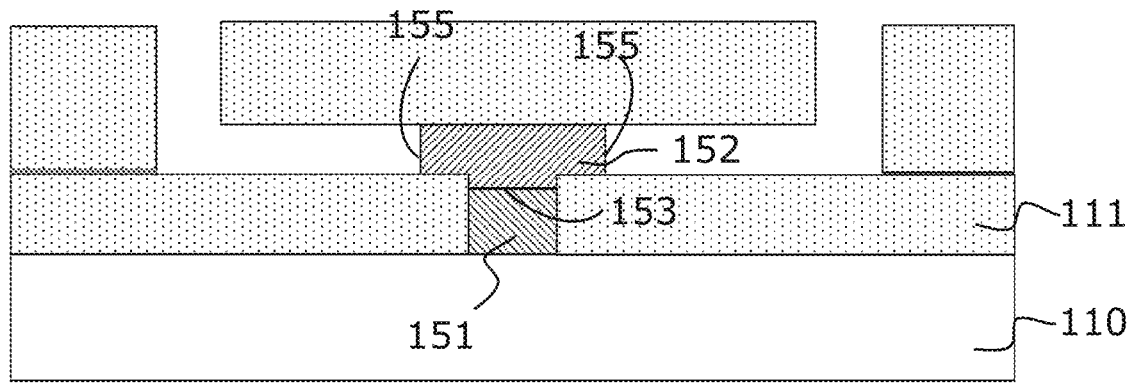
FIG. 11      1100
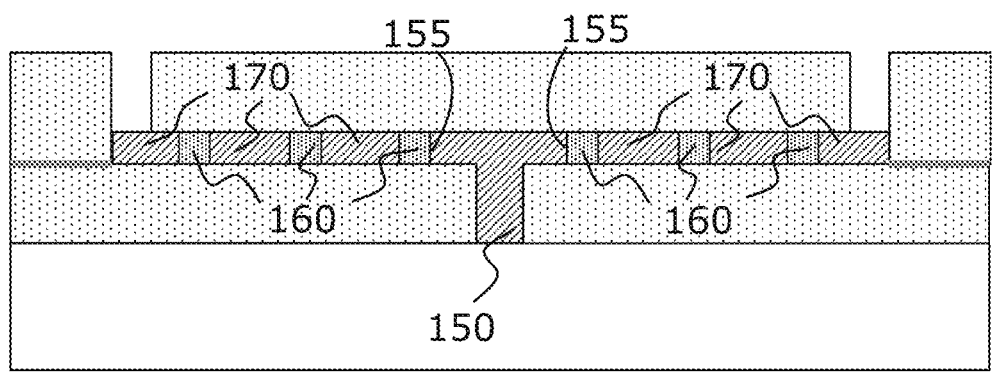
FIG. 12      1200

1300

1400

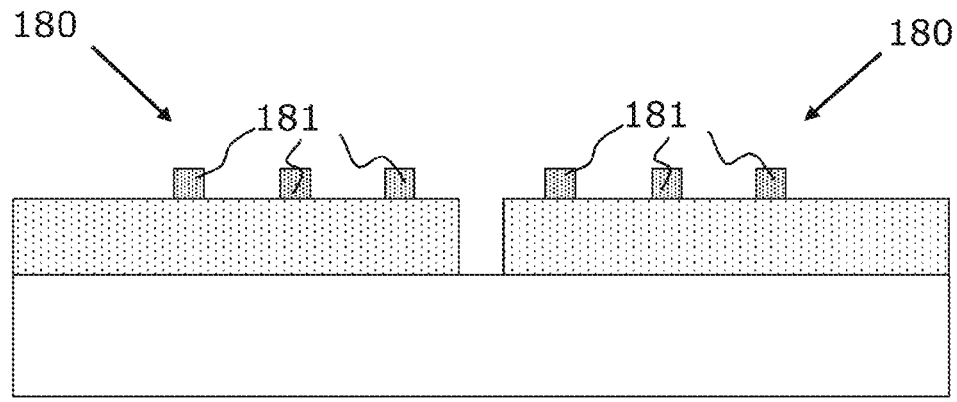
FIG. 15    1500
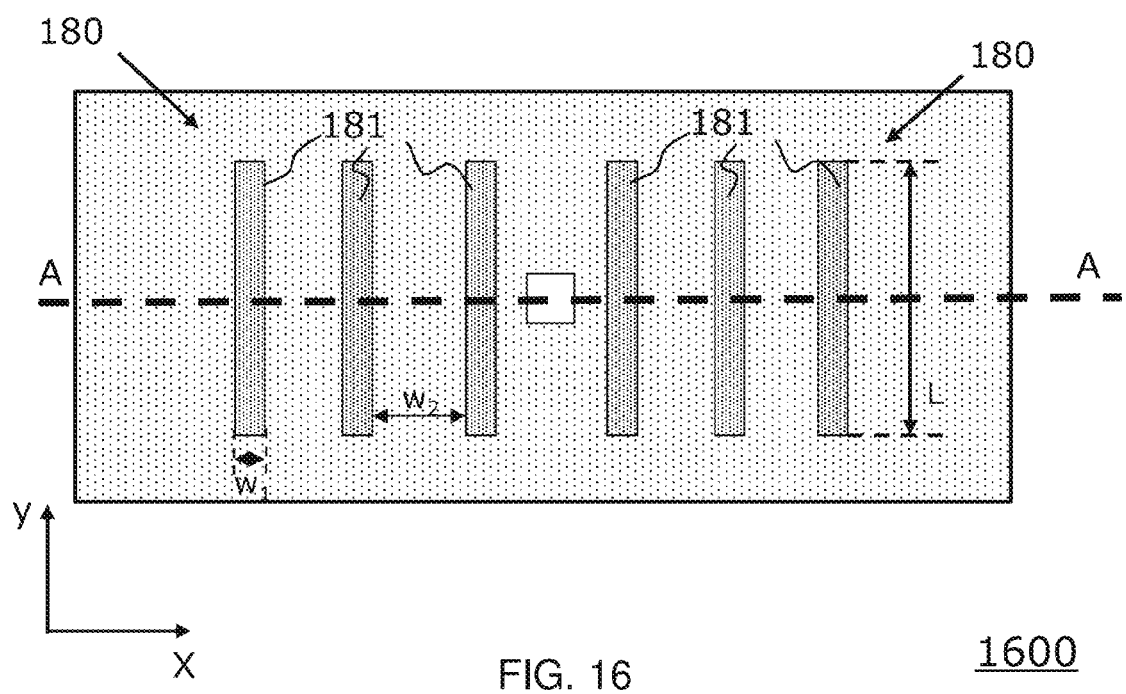
FIG. 16    1600

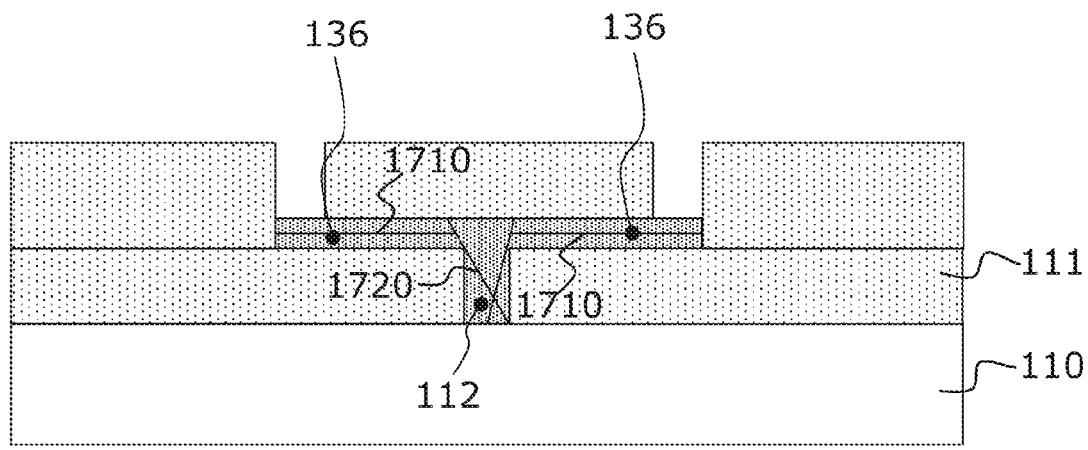
FIG. 17          1700
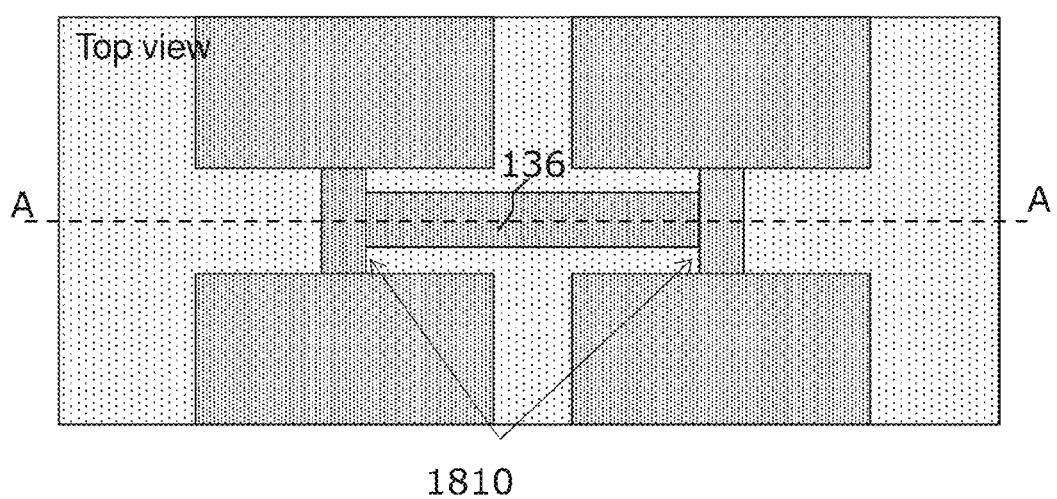
FIG. 18          1800

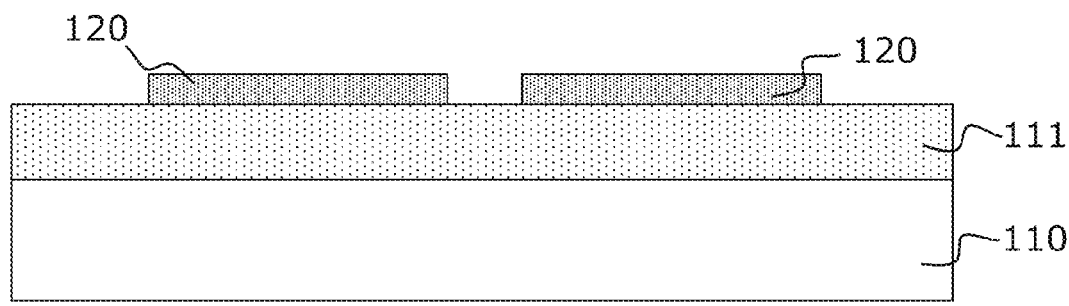
FIG. 19      1900
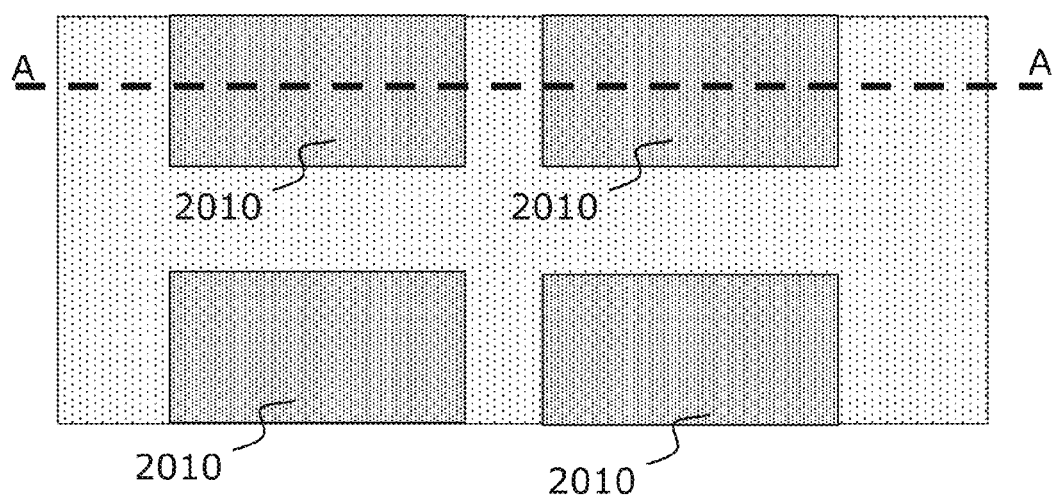
FIG. 20      2000

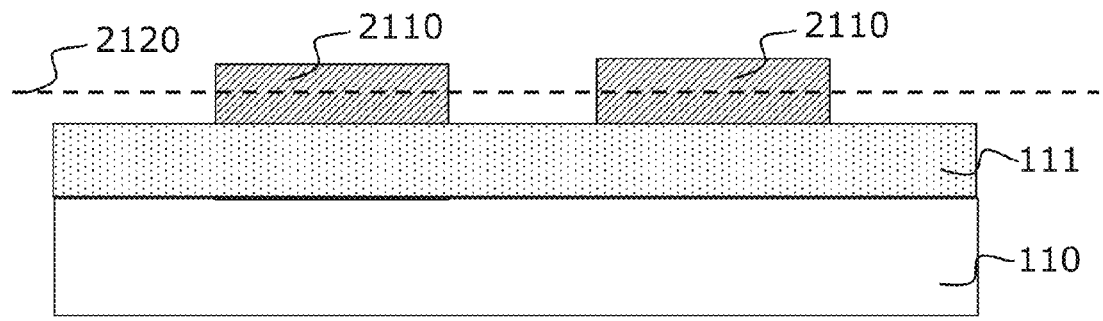
FIG. 21    2100
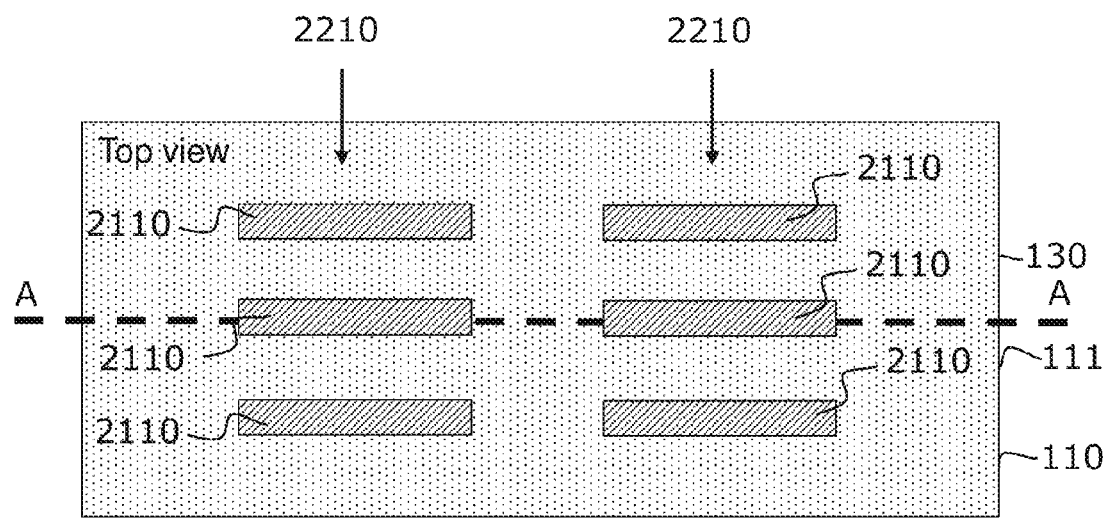
FIG. 22    2200

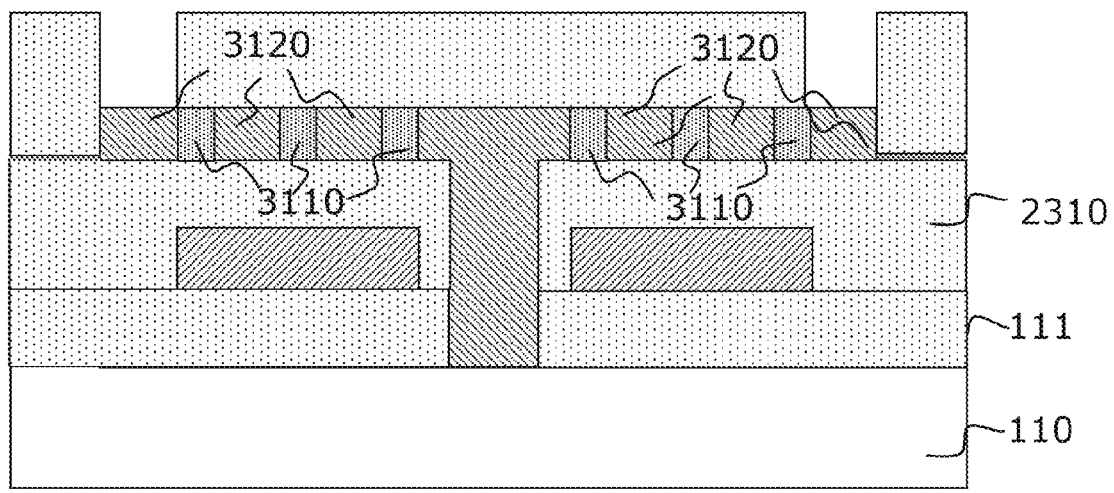
FIG. 31        3100
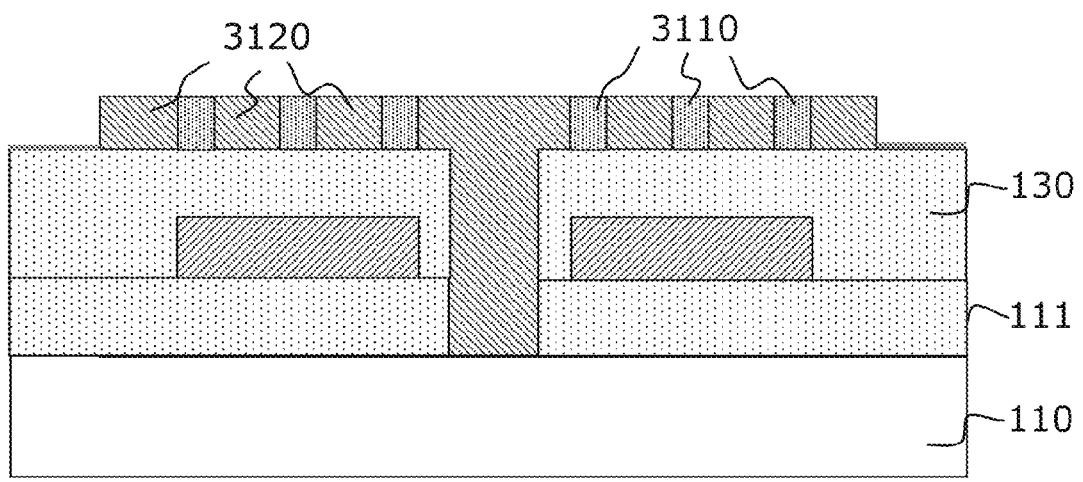
FIG. 32        3200

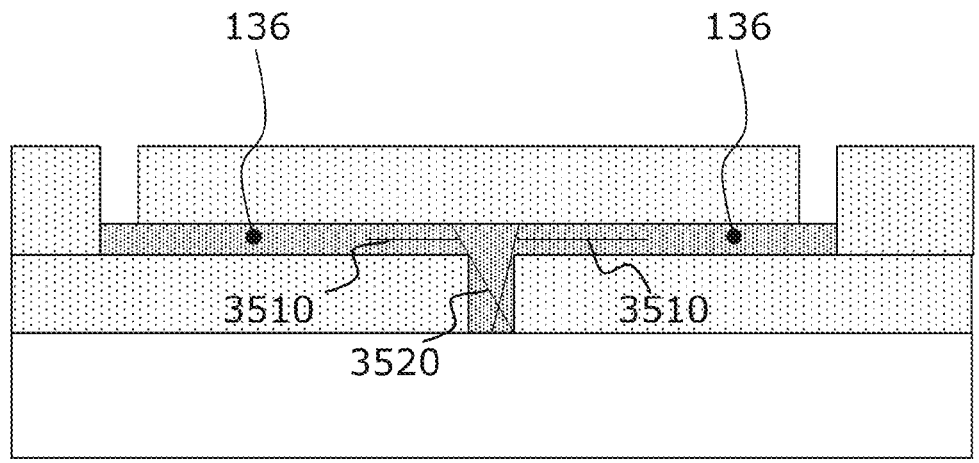
FIG. 35    3500
Top view
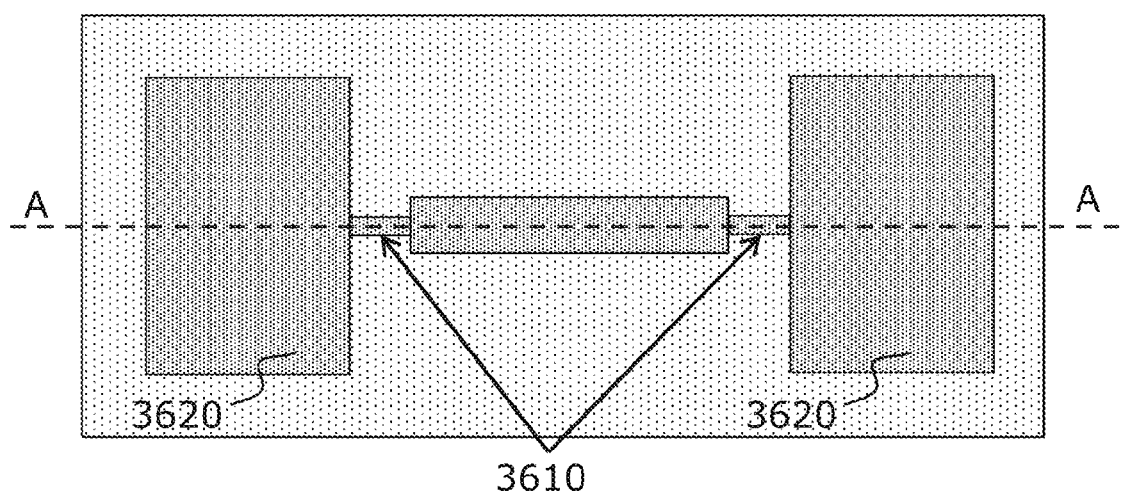
FIG. 36    3600

FABRICATION OF SEMICONDUCTOR FIN STRUCTURES

BACKGROUND

Embodiments of the invention relate generally to the fabrication of semiconductor structures and more particularly to the fabrication of semiconductor fin structures on substrates having an insulating layer.

Silicon is the basic material for present solid-state electronics, and processing techniques have been evolved for decades. Hence, most electronic integrated circuit devices are based on silicon.

However, III-V compound semiconductors, and especially InGaAs, are being considered as a potential alternative for replacing strained Si in the channel of future nFETs due to their remarkable electron mobility. Moreover, some III-V compound semiconductors present several advantages for opto-electronics applications when compared to Si.

A monolithic integration of compound semiconductors on silicon wafers is desirable and has extensively been investigated in the past. Several problems need to be overcome when compound semiconductors and conventional silicon technologies are combined. First, there is a large lattice mismatch between a crystalline silicon substrate and compound semiconductor crystals. Further, there is a thermal expansion coefficient mismatch between the (silicon) wafer material and the active compound semiconductor material. Additionally, a structural mismatch between diamond-like structures and zincblende structures may occur. It is an overall goal to achieve high crystalline quality over various monolithic layers for compound semiconductor on a foreign substrate such as silicon.

In an effort to achieve high crystalline quality in crystalline material layers that show a lattice mismatch, several methods have been developed. For example, direct epitaxy of blanket layers allow for a gradual transition from one lattice parameter to the next. However, relatively thick transition layers are needed to reduce the defect density considerably.

Techniques to combine compound semiconductor materials with conventional silicon wafers include bonding techniques. In direct wafer bonding, a compound hetero structure is fabricated on a donor wafer wherein the donor wafer material is eliminated after bonding with the conventional silicon wafer. This makes the bonding technology relatively expensive. Further, bonding is limited to the size of costly compound substrate wafers.

Another approach for combining lattice-mismatched materials such as compound semiconductors with silicon substrates is the aspect ratio trapping approach. Aspect ratio trapping (ART) refers to a technique where crystalline defects are terminated at non-crystalline, for example dielectric, sidewalls. U.S. Pat. No. 8,173,551 B2 discloses a method where a silicon substrate is covered with a dielectric layer defining trenches through to the substrate material. In the trenches, epitaxial films of a compound material are deposited wherein particular geometries of the growth front are realized. The aspect ratio of the trenches needs to be large enough to terminate the defects that nucleate at the silicon-compound interface so that higher parts of the crystalline compound show a low crystalline defect density. Some approaches of the ART technique teach the use of Germanium microcrystals grown in silicon oxide trenches on a silicon substrate with a gallium arsenide film on top.

Another ART approach is disclosed in U.S. Pat. No. 8,384,196 B2 employing an additional epitaxial layer overgrowth (ELO) of the trenches. Relatively thick compound semiconductor or germanium layers are obtained on the trench-forming dielectric, and the crystalline compound or germanium is preferably planarized prior to further processing.

Furthermore, it is foreseen that III-V compound semiconductors may be used as fin structures fabricated preferentially on an insulating surface. Besides the intrinsic complexity related to advanced lithography, etching of III-V compound semiconductors can be also substantially more challenging than for silicon.

It is therefore desirable to provide improved fabrication methods for semiconductor structures, in particular for semiconductor fin structures comprising semiconductor compound materials.

SUMMARY

According to a first aspect, the invention is embodied as a method for fabricating a semiconductor structure. The method comprises providing a semiconductor substrate, forming an insulating layer on the semiconductor substrate and forming a cavity structure above the insulating layer. The cavity structure comprises a lateral growth channel and a fin seed structure arranged in the lateral growth channel. The fin seed structure provides a seed surface for growing a fin structure. The method further comprises growing sequentially in the growth channel from the seed surface in an alternating way one or more first semiconductor structures of a first semiconductor material and one or more second semiconductor structures of a second semiconductor material. The first semiconductor material is different from the second semiconductor material. Furthermore, the first semiconductor structures provide a seed surface for the second semiconductor structures and the second semiconductor structures provide a seed surface for the first semiconductor structures. Finally the method comprises a step of selectively etching the second semiconductor structures, thereby forming the fin structure comprising a plurality of parallel fins of the first semiconductor structures.

Such a fabrication method allows forming of fin structures in a reliable and cost-efficient way. In particular, such fin structures may be fabricated without using lithography. As lithography is a very expensive fabrication step, this is a significant advantage. Hence according to embodiments a lithography step used in prior art methods for forming a fin structure can be replaced. According to embodiments the fin structures are epitaxially grown in an alternating way with a defined epitaxial sequence that provides a high etching selectivity. This facilitates a reliable and accurate etching and thereby a reliable and accurate formation of the fin structure.

The term "laterally" is used in this context, as is customary, to indicate orientation generally parallel to the plane of the substrate, as opposed to generally vertically, or outwardly, from the substrate surface.

According to embodiments the first semiconductor material and the second semiconductor material have different etching rates in vapor or liquid etchants. In other words, the first and second material can be selectively etched.

According to a preferred embodiment the method comprises forming an opening in the insulating layer. The opening has sidewalls and a bottom and the bottom corresponds to a seed surface of the substrate. The method further comprises growing the fin seed structure from the seed surface of the substrate. This is an efficient and reliable way of forming the seed structure. According to embodiments the fin seed structure can be made of the first semiconductor material, of the second semiconductor material or of a third semiconductor material.

According to a preferred embodiment the first semiconductor material is comprised of a group III-V compound material or a group II-VI compound material.

Group III-V compound materials and group II-VI compound materials are being considered as potential alternative for replacing Si for future semiconductor devices in view of their electron mobility. Moreover, some III-V compound semiconductors present several advantages for opto-electronics applications when compared to Si. Furthermore, in particular ternary materials such as InGaAs are being considered as a potential alternative for replacing strained Si in the channel of future nFETs due to their remarkable electron mobility.

According to a further preferred embodiment the second semiconductor material is comprised of a group III-V compound material or a group II-VI compound material.

This has been found to offer several suitable materials that can be grown on the first semiconductor material with a suitable lattice match and suitable selective etching properties.

According to a further preferred embodiment the width of the first and the second semiconductor structure in the growth direction is controlled via the time of the epitaxial growth. This allows to define the dimensions of the fin structure by epitaxy rather than by lithography.

According to a further preferred embodiment the width in the growth direction of the first semiconductor structure is less than 10 nm. This facilitates a dense integration, as well as the fabrication of ultra narrow fins.

According to a further preferred embodiment the width in the growth direction of the second semiconductor structure is between 10 nm and 30 nm. This facilitates a dense integration.

According to a further preferred embodiment the length of the first and the second semiconductor structure in a direction perpendicular to the growth direction is between 1 um and 10 um.

This allows to form fin structures suitable for advanced device manufacturing such as FINFET devices.

According to a further preferred embodiment the width in the growth direction of the second semiconductor structure is at least two times greater than the width of the first semiconductor structure in the growth direction.

This allows to form structures suitable for advanced device manufacturing such as FINFET devices.

According to a further preferred embodiment the selective etching is performed by wet etching. This is a very cost efficient, simple and yet reliable method.

According to a further preferred embodiment the selective etching is performed by dry-etching. The dry-etching may be preferably performed by Inductive Coupled Plasma (ICP), Reactive Ion Etching (RIE) or Electron Cyclotron Resonance (ECR).

According to a further preferred embodiment the fins are further processed to form a Field Effect Transistor (FET) and the fins establish a channel portion of the FET.

Such FINFETs offer advanced device performance in view of a better electrical control of the channel.

According to a preferred embodiment the first and the second semiconductor materials are selected from the pairs of (InGaAs,InP) or (AlGaSb, GaSb). More generally, material pairs can be selected from the systems In(Ga,Al)As, Ga,Al)(As,Sb) and (In,Ga)(As,P), provided they combine appropriate lattice matching for advantageous growth as well as selective etching properties. This can be for example obtained by alternating InP which etches in HCl and InGaAs which does not etch in HCl.

According to a preferred embodiment the growing of the first and the second semiconductor structures is performed by metal organic chemical vapor deposition (MOCVD), atmospheric pressure CVD, low or reduced pressure CVD, ultra-high vacuum CVD, molecular beam epitaxy (MBE), atomic layer deposition (ALD) or by hydride vapor phase epitaxy.

Such methods are well established and allow a precise and reliable control of the growth.

According to a further preferred embodiment the method comprises growing a first array of fins in a first plane and growing a second array of fins in a second plane above the first plane. Thereby a 3-dimensional fin array structure may be fabricated. This facilitates advanced device topologies, e.g. for memory applications.

According to a further preferred embodiment the method comprises fabricating a first array of fins in a first plane by standard lithography and etching and growing a second array of fins in a second plane above the first plane, thereby fabricating a 3-dimensional fin array structure. This facilitates advanced device topologies, e.g. for memory applications.

According to a further preferred embodiment the method comprises comprising doping the first semiconductor structures by in situ doping.

According to a further preferred embodiment providing the fin seed structure comprises growing a first matching structure on the seed surface of the substrate and growing a second matching structure on a seed surface of the first matching structure.

This facilitates an efficient fabrication of fin structures with low defects and high quality. The first and the second matching structure can advantageously be used to reduce defects in the growth of the fin structures by solving growth mismatches between the involved semiconductor materials. Such growth mismatches may e.g. occur due to the different lattice constants, different crystal structures or other differences between the first and the fourth semiconductor material. The seed surface of the substrate may preferably be embodied as crystalline seed surface.

According to a further preferred embodiment the first and the second matching structure are adapted to solve a growth mismatch between the material of the substrate and the first and/or the second semiconductor material in a stepwise approach. With such a stepwise approach the growth mismatches may be adapted gradually. This allows to address the various possible mismatches step by step.

According to a further preferred embodiment a geometrical constraint is provided in the growth channel to reduce in plane crystalline defects.

According to a further preferred embodiment the geometrical constraint is an in plane necking of the growth channel.

According to a further preferred embodiment the geometrical constraint is a change of the in plane direction of the growth channel.

According to an embodiment of another aspect a semiconductor structure obtainable by a method according to the first aspect is provided.

A further preferred embodiment relates to a wafer comprising a plurality of semiconductor structures obtainable by a method according to the first aspect.

The steps of the different aspects of the invention may be performed in different orders. Furthermore, the steps may also be combined, i.e. that e.g. two or more steps may be performed together.

Advantages of the features of one aspect of the invention may apply to corresponding features of another aspect of the invention.

Embodiments of the invention will be described in more detail below, by way of illustrative and non-limiting examples, with reference to the accompanying drawings.

BRIEF DESCRIPTION OF THE DRAWINGS

FIG. 9 shows a cross-sectional view of the structure of FIG. 8 after growing from the seed surface of the substrate a fin seed structure;

FIG. 10 shows a cross-sectional view after growing from the seed surface of the substrate a first matching structure of a fin seed structure;

FIG. 11 shows a cross-sectional view after growing from a seed surface of the first matching structure a second matching structure of the fin seed structure;

FIG. 12 shows a cross-sectional view after growing from the seed surfaces of the fin seed structure sequentially in an alternating way first semiconductor structures and second semiconductor structures;

FIG. 15 shows a cross-sectional view of the structure of FIG. 13 after selectively etching the second semiconductor structures;

FIG. 16 shows a corresponding top view of the structure of FIG. 15;

FIG. 17 shows a cross-sectional view of a structure having a lateral growth channel with a 90° curve as geometrical constraint for reducing in plane defects;

FIG. 18 shows a corresponding top view of the structure of FIG. 17;

FIG. 19 shows a cross-sectional view of the structure of FIG. 17 after removal of the cavity structure;

FIG. 20 shows a top view corresponding to the cross-sectional view of the structure of FIG. 19;

FIG. 21 shows a cross-sectional view after forming a plurality of fins arranged in a first plane on an insulating layer of a substrate;

FIG. 22 shows a top view corresponding to the cross-sectional view of the structure of FIG. 21;

FIG. 31 shows a cross-sectional view after growing from seed surfaces of the fin seed structure sequentially in an alternating way first semiconductor structures and second semiconductor structures;

FIG. 32 shows a cross-sectional view after removal of the cavity structure;

FIG. 35 shows a cross-sectional view of a structure having lateral growth channels with in plane neckings as geometrical constraint for reducing in plane defects;

FIG. 36 shows a corresponding top view of the structure of FIG. 35.

DETAILED DESCRIPTION

FIGS. 1-16 show successive stages of a method for fabricating a fin semiconductor structure.

FIGS. 1-16 and the other Figures subsequently described below generally show enlarged cross-sectional views or top views of initial, intermediate and final structures formed during the stages of the method. In any or all of the figures the dimensions may not be drawn to scale and may be shown in a simplified and schematic way to illustrate the features and principles of embodiments of the invention.

Figure 1:
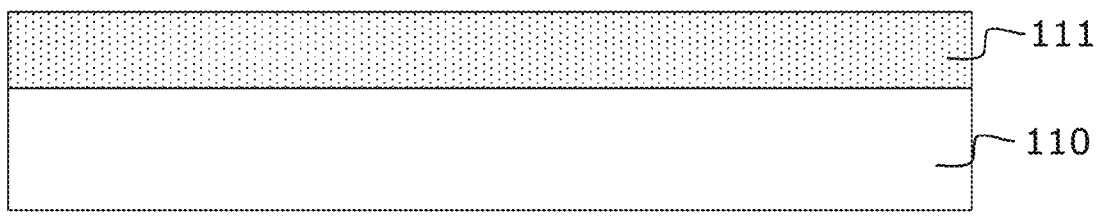
FIG. 1 illustrates a cross-sectional view of an initial structure comprising a substrate covered with an insulating layer.

FIG. 1 illustrates a cross-sectional view of an initial structure 100. The initial structure 100 comprises a substrate 110. The substrate 110 comprises a first semiconductor material and may be e.g. a bulk semiconductor substrate, a substrate comprising an insulating layer such as a silicon on insulator (SOI) substrate or a hybrid substrate. The substrate 110 may be embodied as a crystalline semiconductor or a compound semiconductor wafer of a large diameter. The substrate may comprise, for example, a material from group IV of the periodic table as first semiconductor material. Materials of group IV include, for example, silicon, germanium, mixed silicon and germanium, mixed silicon and carbon, mixed silicon germanium and carbon and the like. For example, the substrate 110 may be a crystalline silicon wafer that is used in the semiconductor industry.

On the substrate 110 an insulating layer 111 is provided. The insulating layer 111 may be embodied e.g. as a dielectric layer. The insulating layer 111 can be formed by known methods, as for example thermal oxidation, chemical vapor deposition (CVD), plasma enhanced CVD (PECVD), atomic layer deposition, chemical solution deposition, MOCVD, evaporation, sputtering and other deposition processes. Examples of such dielectric material include, but are not limited to: SiO2, Si3N4, Al2O3, AlON, Ta2O5, TiO2, La2O3, SrTiO3, LaAlO3, ZrO2, Y2O3, Gd2O3, MgO, MgNO, Hf-based materials and combinations including multilayers thereof.

The thicknesses of the substrate 110 and the insulating layer 111 can be any suitable thicknesses.

Figure 2:
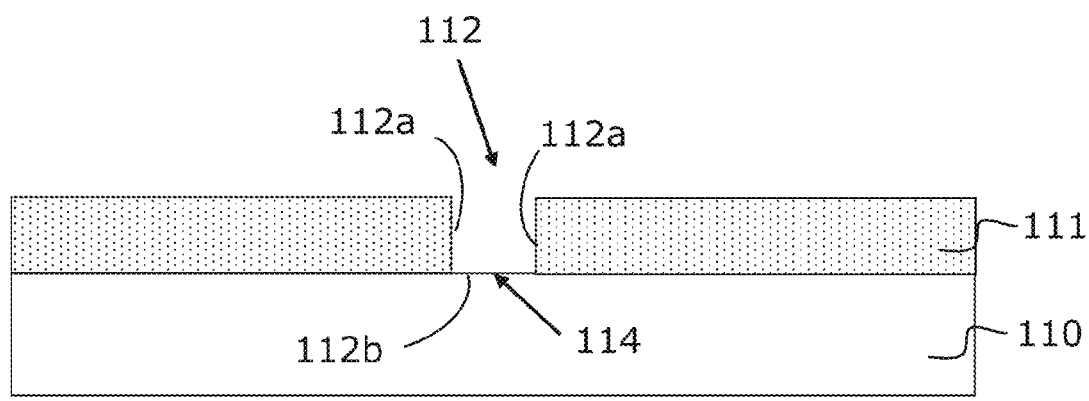
FIG. 2 shows a cross-sectional view of the structure of FIG. 1 after an opening has been formed in the insulating layer.

FIG. 2 shows a cross-sectional view of a structure 200 after an opening 112 has been formed in the insulating layer 111. The opening 112 has sidewalls 112a and a bottom 112b. The bottom 112b corresponds to a seed surface 114 of the substrate. The formation of the opening 112 may be performed by lithography and subsequent wet or dry etching techniques.

Figure 3:
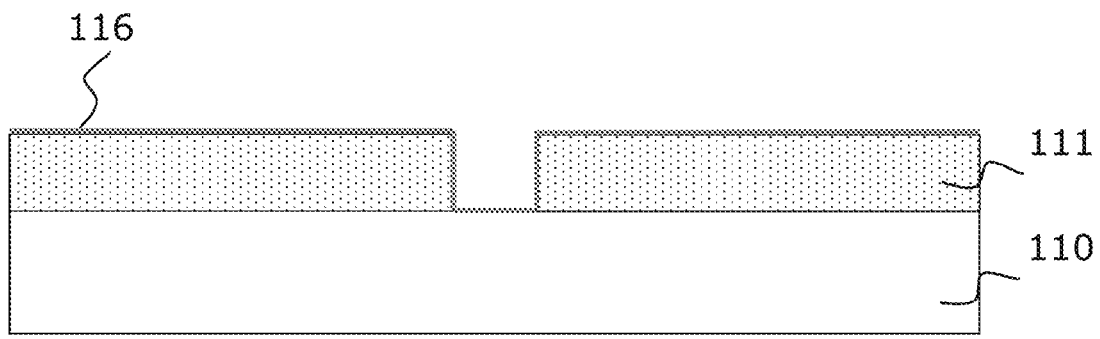
FIG. 3 shows a cross-sectional view of the structure of FIG. 2 after a high-k layer has been deposited on exposed surfaces of the insulating layer and a seed surface of the substrate.

FIG. 3 shows a cross-sectional view of a structure 300 after a high-k layer 116 has been deposited by conformal deposition of a high-k material on the exposed surfaces of the insulating layer 111 and seed surface 114. The high-k material may be preferably embodied as Al2O3, HfO2 and combinations thereof. The conformal deposition of the high-k material may be performed by methods well known in the art such as PECVD or PEALD.

Figure 4:
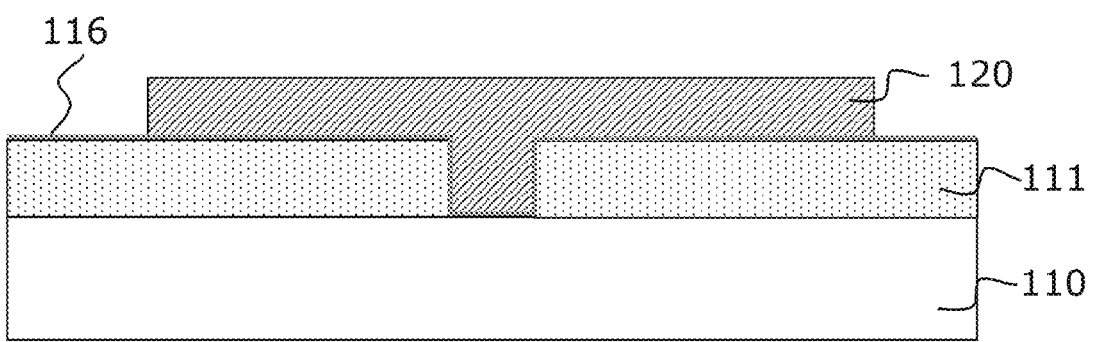
FIG. 4 shows a cross-sectional view of the structure of FIG. 3 after a sacrificial structure has been formed on the insulating layer and the high-k layer.

FIG. 4 shows a cross-sectional view of a structure 400 after a sacrificial structure 120 has been formed on the insulating layer 111 and the high-k layer 116 respectively. The sacrificial structure 120 comprises a sacrificial material. The sacrificial structure 120 establishes a negative mold for a cavity to be formed subsequently. According to some embodiments the sacrificial structure 120 may comprise amorphous silicon as sacrificial material. According to other embodiments one may also use polymers or other suitable materials that can be removed easily in a subsequent step. According to another preferred embodiment the sacrificial material may comprise $Si_xGe_{1-x}$ where x=0 to 1, poly-Silicon or amorphous Silicon or amorphous carbon. This allows to use a plurality of well-known and established fabrication processes and methods to form the sacrificial structure 120. The sacrificial structure 120 may be deposited in a technology that is particularly suitable for the respective sacrificial material and may have any desired form and shape. Fabrication processes such as lithography and etching processes may be adapted and optimized for the respective sacrificial material.

Figure 5:
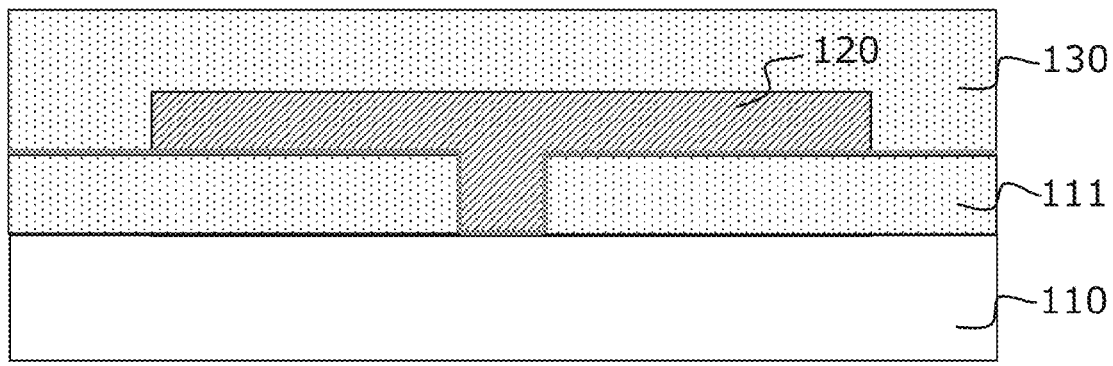
FIG. 5 shows a cross-sectional view of the structure of FIG. 5 after a cavity layer has been formed.

FIG. 5 shows a cross-sectional view of a structure 500 after a cavity layer 130 has been formed on all exposed surfaces of the structure 400. More particularly, the cavity layer 130 was formed on the sacrificial structure 120 and on the insulating layer 111. The cavity layer 130 is typically an insulating layer, e.g. of an oxide such as silicon oxide or silicon nitride, but might also be a layer of carbon or of other materials suppressing deposition of the semiconductor during a subsequent selective growth in the cavity structure. According to an embodiment the cavity layer 130 may be formed e.g. as blanket oxide layer using conformal deposition techniques as mentioned above.

According to embodiments the material of the cavity layer 130 is selected to have a low sticking coefficient, and hence low nucleation probability, for the semiconductor material to be grown in the cavity structure.

Figure 6:
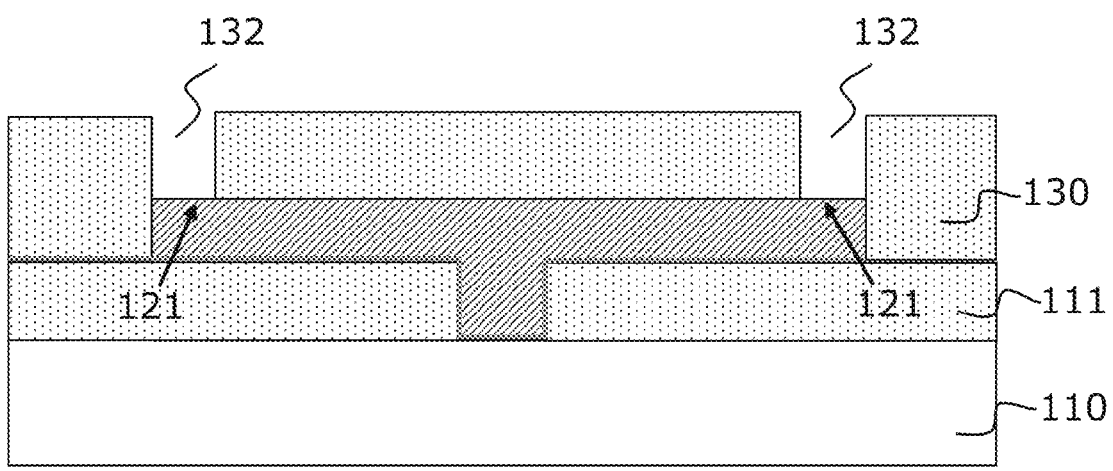
FIG. 6 shows a cross-sectional view of the structure of FIG. 5 after two inlets have been formed in the cavity layer.

FIG. 6 shows a cross-sectional view of a structure 600 after two inlets 132 have been formed in the cavity layer 130. This has exposed surfaces 121 of the sacrificial structure 120. The formation of the inlets 132 may be performed by lithography and subsequent wet or dry etching techniques.

Figure 7:
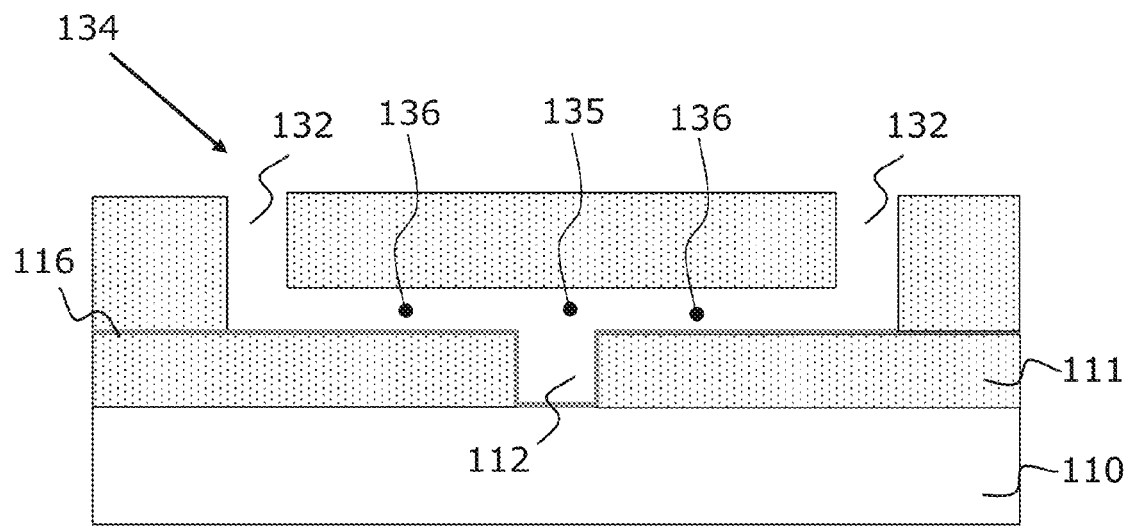
FIG. 7 shows a cross-sectional view of the structure of FIG. 6 after the sacrificial structure has been selectively removed.

FIG. 7 shows a cross-sectional view of a structure 700 after the sacrificial material of the sacrificial structure 120 has been selectively removed. This has formed a cavity structure 134 comprising a cavity 135 above the insulating layer 111. The cavity 135 comprises the opening 112 and two lateral growth channels 136 extending laterally over the substrate 110. The selective removal may be performed by selective etching techniques. The suitable etching technique may depend on the material used as sacrificial material. There are, for example, etching techniques available that selectively remove amorphous silicon as sacrificial material. According to a preferred embodiment the sacrificial material may be $Si_xGe_{1-x}$ and the selective etching may be performed by dry etching with e.g. xenon difluoride ($XeF_2$) or wet etching with e.g. TMAH. In general the etching technique is chosen to be such that it only etches the sacrificial material of the sacrificial structure 120, but neither the material of the cavity layer 130 nor the material of the high-k layer 116. Accordingly the etching stops at the high-k layer 116.

Figure 8:
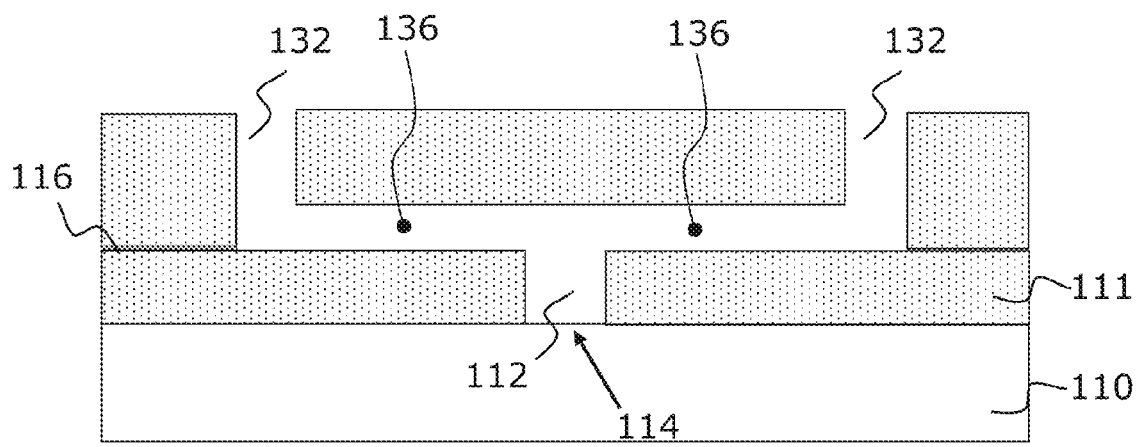
FIG. 8 shows a cross-sectional view of the structure of FIG. 7 after the high-k-layer has been selectively removed.

FIG. 8 shows a cross-sectional view of a structure 800 after the high-k-layer 116 has been selectively removed. The selective removal of the high-k layer 116 may be performed by suitable selective etching techniques that are chosen to be such that they only etch the high-k-layer, but neither the material of the cavity layer 130 nor the substrate 110. Accordingly the etching stops at the substrate 110.

FIG. 9 shows a cross-sectional view of a structure 900 after growing from the seed surface 114 of the substrate 110 a fin seed structure 150 comprising a semiconductor material. The fin seed structure 150 provides seed surfaces 155 for subsequently growing a fin structure in the lateral growth channels 136.

FIGS. 10 and 11 shows cross-sectional views of structures 1000 and 1100 according to which the fin seed structure 150 comprises a first matching structure 151 and a second matching structure 152.

FIG. 10 shows the first matching structure 151 comprising a semiconductor material that has been grown from the seed surface 114 of the substrate 110.

FIG. 11 shows the second matching structure 152 that has been grown from a seed surface 153 of the first matching structure 151.

The first matching structure 151 and the second matching structure 152 form the fin seed structure 150 as a matching array. The matching array comprising the first and the second matching structure can advantageously be used to reduce defects in the subsequent growth of the fin structure by solving growth mismatches between the semiconductor material of the substrate and the semiconductor material of the fin structure. Such growth mismatches may e.g. occur due to the different lattice constants, different crystal structures or other differences between the semiconductor materials. The seed surface of the substrate may preferably be embodied as crystalline seed surface.

In general the first matching structure 151 and the second matching structure 152 are designed to solve a growth mismatch between the semiconductor materials in a stepwise approach.

In the following example it is assumed that the fin seed structure 150 will be embodied as a single seed structure as shown in FIG. 9.

FIG. 12 shows a cross-sectional view of a structure 1200 after growing from the seed surfaces 155 of the fin seed structure 150 sequentially in the lateral growth channels 136 in an alternating way first semiconductor structures 160 of a first semiconductor material and second semiconductor structures 170 of a second semiconductor material. The first semiconductor material is different from the second semiconductor material. In this example it is assumed that the second semiconductor material is the same material as the semiconductor material of the fin seed structure 150, but according to other embodiments the semiconductor materials of the fin seed structure 150 and the second semiconductor structures 170 may be different. The first semiconductor structures 160 provide a seed surface for the second semiconductor structures 170 and the second semiconductor structures 170 provide a seed surface for the first semiconductor structures 160. The first semiconductor material and the second semiconductor material have different etching rates in vapor or liquid etchants.

Figure 13:
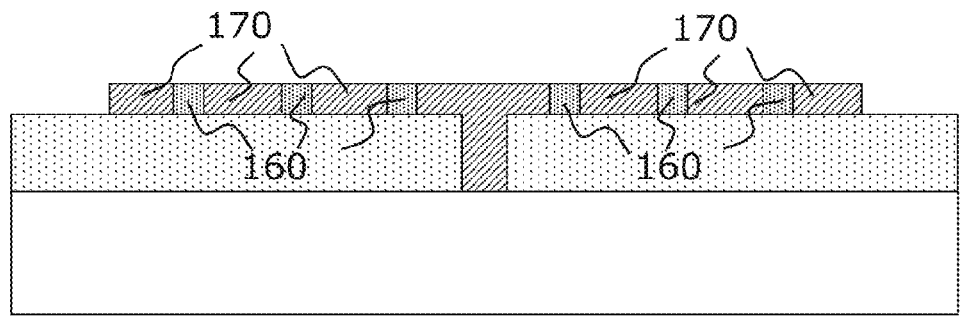
FIG. 13 shows a cross-sectional view the structure of FIG. 12 after removal of the cavity structure.

FIG. 13 shows a cross-sectional view of a structure 1300 after removal of the cavity structure.

Figure 14:
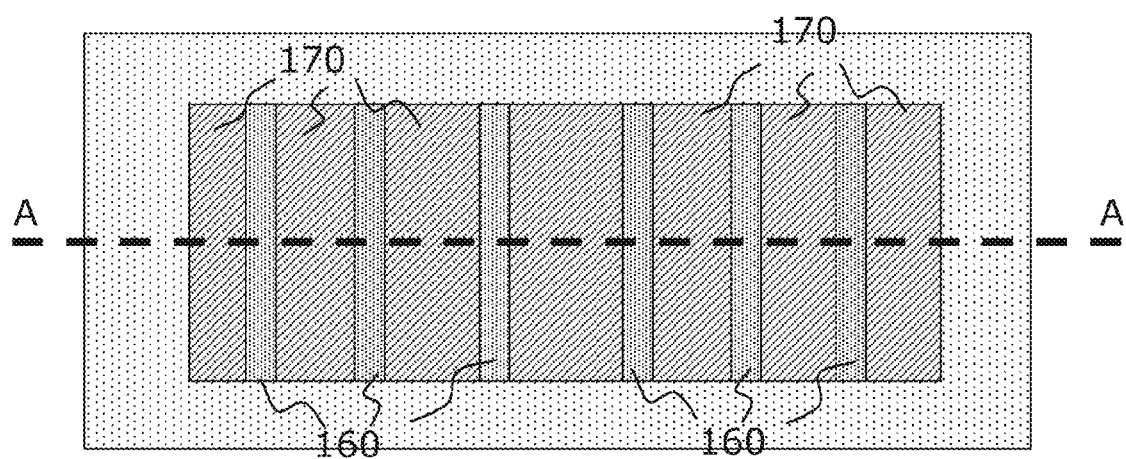
FIG. 14 shows a corresponding top view of the structure of FIG. 13.

FIG. 14 shows a corresponding top view of the structure 1300. More particularly, the structure 1300 is a cross section taken along the line A-A of FIG. 14.

FIG. 15 shows a cross-sectional view of a structure 1500 after selectively etching and thereby removing the second semiconductor structures 170. This has formed fin structures 180 comprising a plurality of parallel fins 181 of the first semiconductor structures 160.

FIG. 16 shows a corresponding top view of the structure 1500. More particularly, the structure 1500 is a cross section taken along the line A-A of FIG. 16.

The fin structures 180 may be e.g. used to fabricate FIN FETs.

The width $w_1$ of the first semiconductor structures 160 in the growth direction x (corresponding to the fins 181) and the width $w_2$ of the second semiconductor structures 170 in the growth direction x can be controlled via the time of the epitaxial growth.

According to embodiments the width $w_1$ in the growth direction x of the first semiconductor structures 160 is less than 10 nm. According to embodiments the width $w_2$ in the growth direction x of the second semiconductor structures 170 is between 10 nm and 30 nm.

According to embodiments the length L of the first semiconductor structures 160 and the second semiconductor structures 170 in a direction y perpendicular to the growth direction x is between 1 um and 10 um. Preferably the width $w_2$ in the growth direction x of the second semiconductor structures 170 is at least two times greater than the width $w_1$ of the first semiconductor structures 160 in the growth direction x.

The selective etching may be performed by etching techniques well known in the art. According to some embodiments wet etching techniques may be used.

According to other embodiments dry-etching techniques such as Inductive Coupled Plasma (ICP), Reactive Ion Etching (RIE) or Electron Cyclotron Resonance (ECR may be used.

According to some embodiments the fins 181 are further processed to form Field Effect Transistors (FETs). For this, the fins 181 may in particular form channel portions of the FETs.

The first and/or the second semiconductor materials of the first and the second semiconductor structures may be generally any material suitable for epitaxial growth. According to preferred embodiments the first and/or second semiconductor materials may be a group III-V compound semiconductor material. The group III-V material could be a binary material such, as for example, Gallium Arsenide (GaAs) or Gallium Antimonide (GaSb). The group III-V material could also be a ternary material such as, for example, Indium Gallium Arsenide (InGaAs) or Indium Gallium Antimonide (InGaSb). According to other embodiments group II-VI semiconductor compounds, mixed II-VI compounds, and IV-VI compounds may be used. According to another preferred embodiment $In_xGa_{1-x}As$ where x=0 to 1 may be used. According to other embodiments further alloyed combinations of (In, Ga) and (As, Sb, P) may be used. Further examples include gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe) and the like.

According to embodiments the first and the second semiconductor material are chosen to be such to have a good etching selectivity to facilitate an efficient and reliable etching of the second semiconductor structures 170. According to embodiments the first semiconductor structures 160 comprises InGaAs as first semiconductor material and the second semiconductor structures 170 comprise InP as second semiconductor material. This has been found to provide advantageous selective etching properties, in particular by wet etching with HCl.

According to embodiments the fin seed structure 150 comprises also InP as semiconductor material.

According to a preferred embodiment of a fin seed structure 150 that comprises the first matching structure 151 and the second matching structure 151, a material combination as follows may be used. The semiconductor material of the substrate 110 is silicon, the semiconductor material of the adjacent first matching structure 151 is GaP and the semiconductor material of the second matching structure 152 is InP. Finally the first semiconductor material of the first semiconductor structure 160 is InGaAs and the second semiconductor material of the second semiconductor structure 170 is InP.

The growth of the fin seed structure, the first semiconductor structures and the second semiconductor structures may be performed in particular by selective epitaxy in any suitable deposition system. For example, metal organic chemical vapor deposition (MOCVD), atmospheric pressure CVD, low or reduced pressure CVD, ultra-high vacuum CVD, molecular beam epitaxy (MBE) or atomic layer deposition (ALD) techniques can be employed.

FIGS. 17-20 illustrate exemplary embodiments of a growth channel that is provided with geometrical constraints to reduce in plane crystalline defects.

FIG. 17 shows a cross-sectional view of a structure 1700 having lateral growth channels 136. In a plane extending laterally over the substrate 110, in plane defects 1710 have been propagated in the lateral growth channels 136. In addition, defects 1720 have been grown in the opening of the insulating layer 111, but as these have propagated vertically/outwardly to the surface of the substrate 110, they can be filtered out by the 90° curve between the opening 112 and the growth channels 136.

FIG. 18 shows a corresponding top view of the structure 1700. More particularly, the structure 1700 is a cross section taken along the line A-A of FIG. 18. As can be seen in FIG. 18, geometrical constraints 1810 have been provided. In this embodiment the geometrical constraints 1810 are 90° in plane turns that provide a change of the in plane direction of the growth channel 136. These geometrical constraints 3610 filter out the in plane defects 1710.

FIG. 19 shows a cross-sectional view of a structure 1900 after removing the cavity structure 134 from the structure 1700 of FIG. 17 and after partially removing the grown semiconductor material from the opening 112, the lateral growth channel 136 and the geometrical constraint 1810.

FIG. 20 shows a top view corresponding to the cross-sectional view of the structure 1900. More particularly, the structure 1900 is a cross section taken along the line A-A of FIG. 20. The structure 2000 comprises 4 compound semiconductor structures 2010 that may be subsequently used as starting structures to form semiconductor devices, e.g. FETs, on top of it. As an example, the compound semiconductor structures 2010 may be used as channel structures for subsequently formed FETs.

FIGS. 21-34 illustrates steps of a method for forming a 3-dimensional fin array structure.

FIG. 21 shows a cross-sectional view of a structure 2100 after forming a plurality of fins 2110 arranged in a first plane 2120 on an insulating layer 111 of a substrate 110.

FIG. 22 shows a top view corresponding to the cross-sectional view of the structure 2100. More particularly, the structure 2100 is a cross section taken along the line A-A of FIG. 22.

As shown in FIG. 22, the structure 2200 comprises two first arrays 2210 of the fins 2110 in the first plane 2120.

The structures 2100/2200 can be fabricated with methods as explained with reference to FIGS. 1-14.

Figure 23:
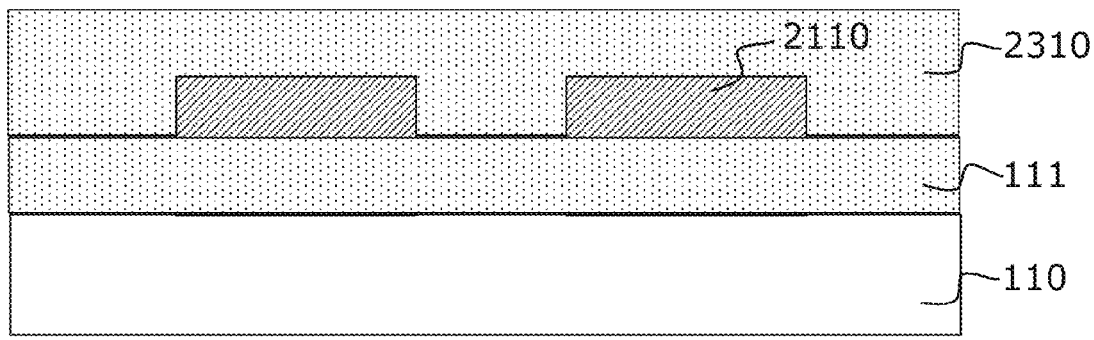
FIG. 23 shows a cross-sectional view of a structure after forming an insulating layer on the structure of FIG. 21.

FIG. 23 shows a cross-sectional view of a structure 2300 after forming an insulating layer 2310 on the structure 2100/2200.

Figure 24:
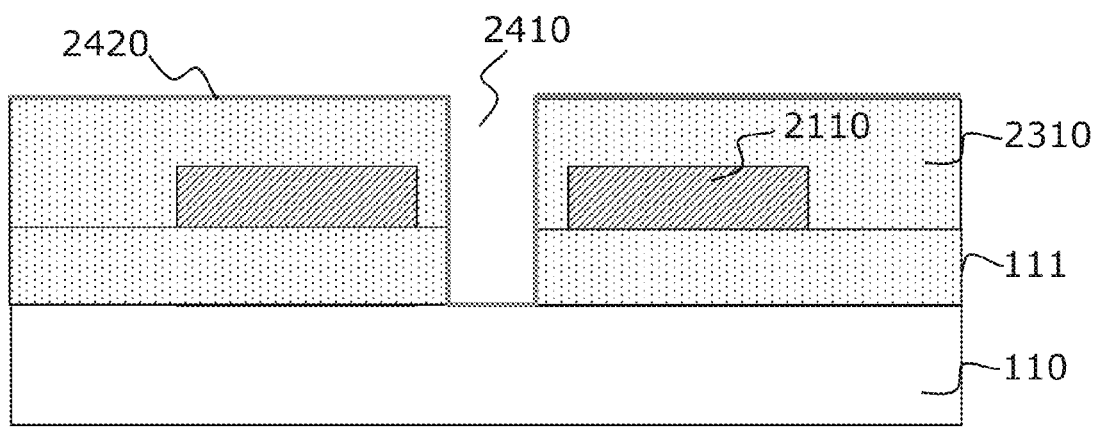
FIG. 24 shows a cross-sectional after an opening has been formed in the insulating layer.

FIG. 24 shows a cross-sectional view of a structure 2400 after an opening 2410 has been formed in the insulating layers 111 and 2310. The opening 2410 has sidewalls and a bottom. The bottom corresponds to a seed surface of the substrate 110. The formation of the opening 2410 may be performed by lithography and subsequent wet or dry etching techniques.

Furthermore, a high-k layer 2420 has been deposited by conformal deposition of a high-k material on the exposed surfaces of the insulating layer 111 and the substrate 110. The conformal deposition of the high-k material may be performed by methods well known in the art such as PECVD or PEALD.

Figure 25:
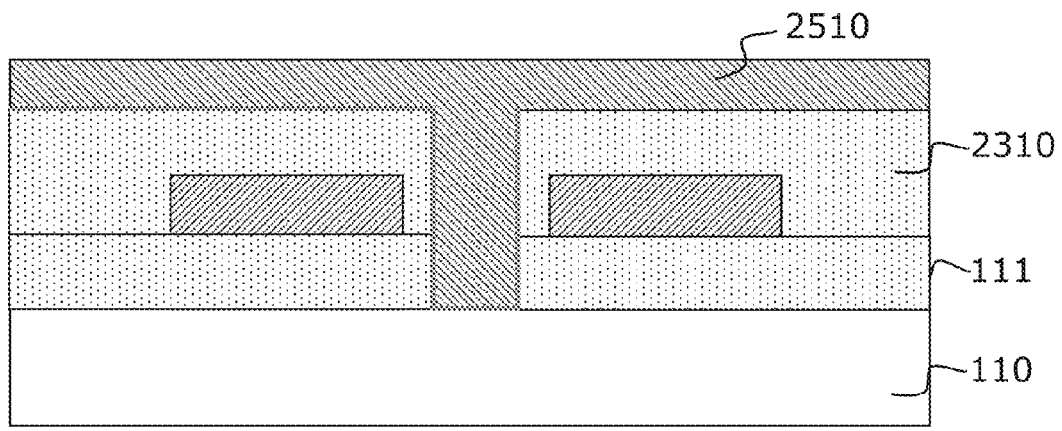
FIG. 25 shows a cross-sectional view of a structure after a sacrificial structure has been formed on the insulating layer.

FIG. 25 shows a cross-sectional view of a structure 2500 after a sacrificial structure 2510 has been formed on the insulating layer 2310 and the high-k layer 2420 respectively. The sacrificial structure 2510 comprises a sacrificial material. The sacrificial structure 2510 establishes a negative mold for a cavity to be formed subsequently. According to some embodiments the sacrificial structure 2510 may comprise amorphous silicon as sacrificial material. According to other embodiments one may also use polymers or other suitable materials that can be removed easily in a subsequent step. According to another preferred embodiment the sacrificial material may comprise $Si_xGe_{1-x}$ where x=0 to 1, poly-Silicon or amorphous Silicon. The sacrificial structure 120 may again be deposited in a technology that is particularly suitable for the respective sacrificial material and may have any desired form and shape. Fabrication processes such as lithography and etching processes may be adapted and optimized for the respective sacrificial material.

Figure 26:
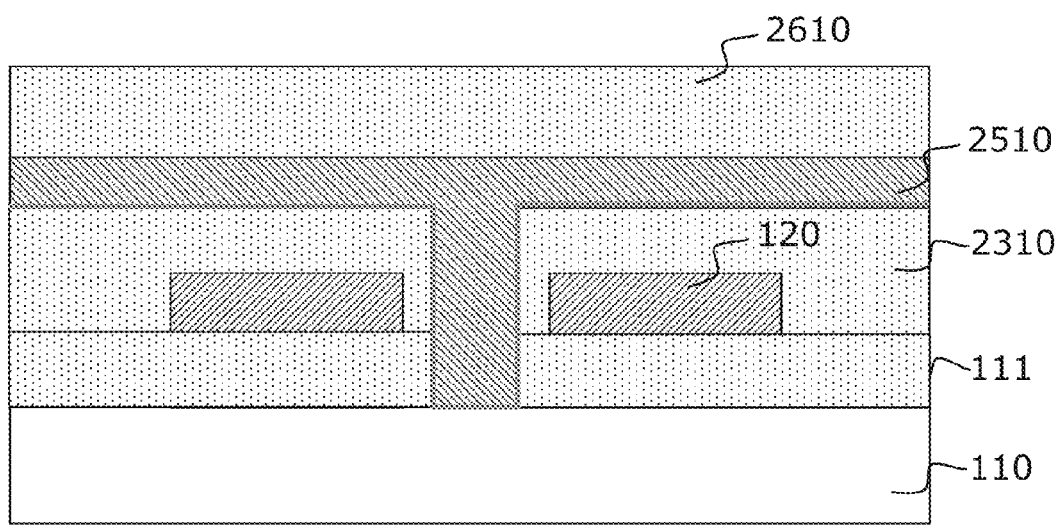
FIG. 26 shows a cross-sectional view after a cavity layer has been formed.

FIG. 26 shows a cross-sectional view of a structure 2600 after a cavity layer 2610 has been formed on all exposed surfaces of the structure. More particularly, the cavity layer 2610 was formed on the sacrificial structure 2510. The cavity layer 2510 is typically an insulating layer, e.g. of an oxide such as silicon oxide or silicon nitride as explained above.

Figure 27:
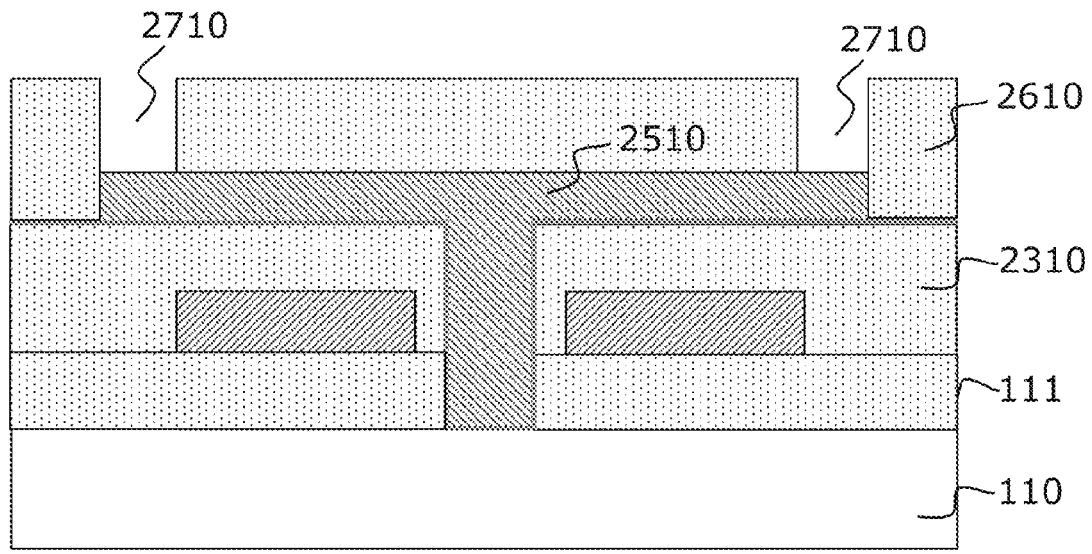
FIG. 27 shows a cross-sectional view after two inlets have been formed in the cavity layer.

FIG. 27 shows a cross-sectional view of a structure 2700 after two inlets 2710 have been formed in the cavity layer 2610. This has exposed surfaces of the sacrificial structure 2510. The formation of the inlets 2710 may be performed by lithography and subsequent wet or dry etching techniques.

Figure 28:
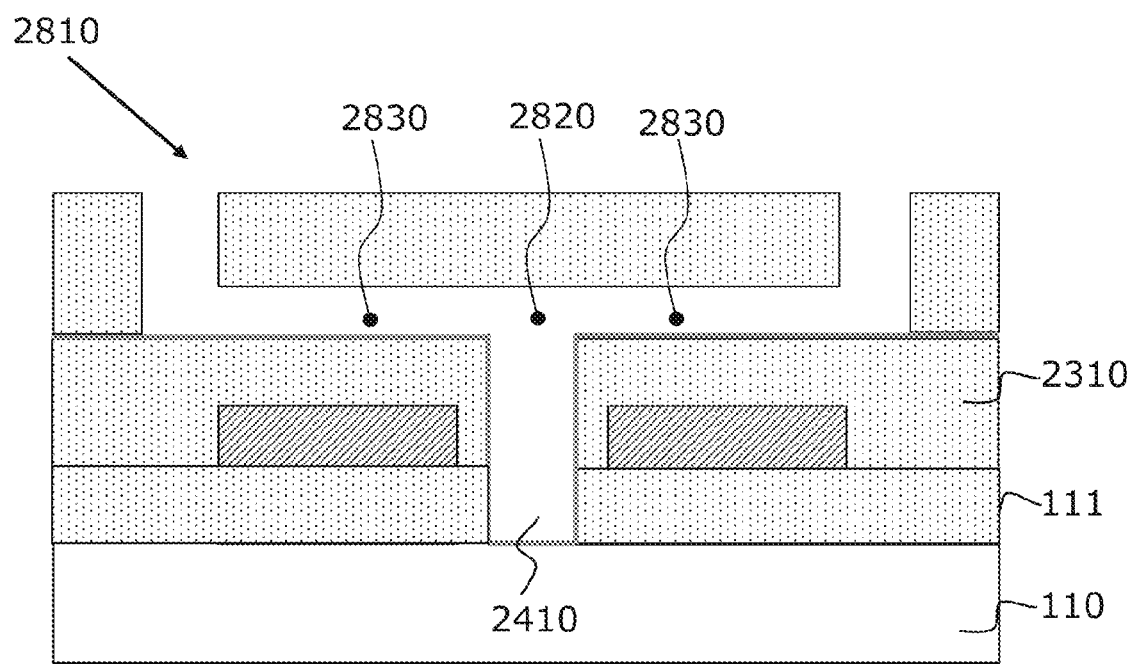
FIG. 28 shows a cross-sectional view after the sacrificial material of the sacrificial structure has been selectively removed.

FIG. 28 shows a cross-sectional view of a structure 2800 after the sacrificial material of the sacrificial structure 2510 has been selectively removed. This has formed a cavity structure 2810 comprising a cavity 2820. The cavity 2820 comprises the opening 2410 and two lateral growth channels 2830 extending laterally over the substrate 110. The selective removal may be performed by selective etching techniques. The suitable etching technique may depend on the material used as sacrificial material as explained above. In general the etching technique is chosen to be such that it only etches the sacrificial material of the sacrificial structure 2510, but neither the material of the cavity layer 2610 nor the material of the high-k layer 2420.

Figure 29:
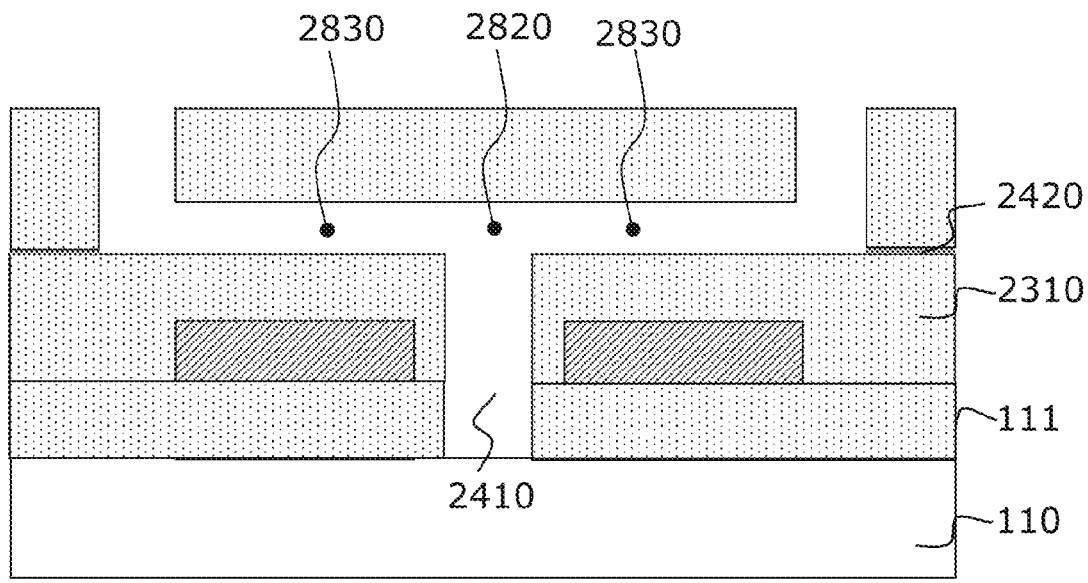
FIG. 29 shows a cross-sectional view after a high-k-layer has been selectively removed.

FIG. 29 shows a cross-sectional view of a structure 2900 after the high-k-layer 2420 has been selectively removed. The selective removal of the high-k layer 2420 may be performed by suitable selective etching techniques that are chosen to be such that they only etch the high-k-layer, but neither the material of the cavity layer 2610 nor the substrate 110. Accordingly the etching stops at the substrate 110.

Figure 30:
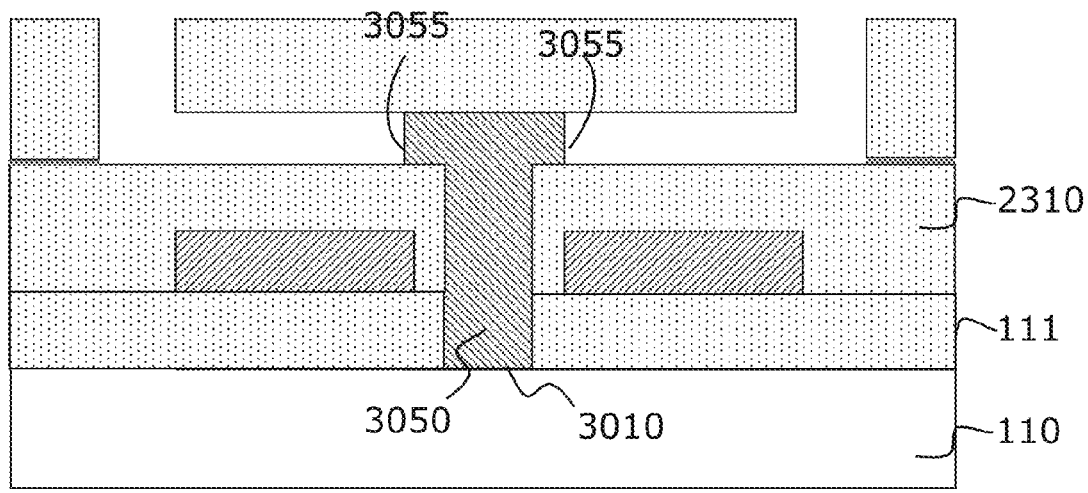
FIG. 30 shows a cross-sectional view after growing from a seed surface of the substrate a fin seed structure.

FIG. 30 shows a cross-sectional view of a structure 3000 after growing from the seed surface 3010 of the substrate 110 a fin seed structure 3050 comprising a semiconductor material. The fin seed structure 3050 provides seed surfaces 3055 for subsequently growing a fin structure in the lateral growth channels 2830.

FIG. 31 shows a cross-sectional view of a structure 3100 after growing from the seed surfaces 3055 of the fin seed structure 3050 sequentially in the lateral growth channels 2830 in an alternating way first semiconductor structures 3110 of a first semiconductor material and second semiconductor structures 3120 of a second semiconductor material. The first semiconductor material is different from the second semiconductor material. In this example it is assumed that the second semiconductor material is the same material as the semiconductor material of the fin seed structure 3050, but according to other embodiments the semiconductor materials of the fin seed structure 3050 and the second semiconductor structures 3120 may be different. The first semiconductor structures 3110 provide a seed surface for the second semiconductor structures 3120 and the second semiconductor structures 3120 provide a seed surface for the first semiconductor structures 3110.

FIG. 32 shows a cross-sectional view of a structure 3200 after removal of the cavity structure.

Figure 33:
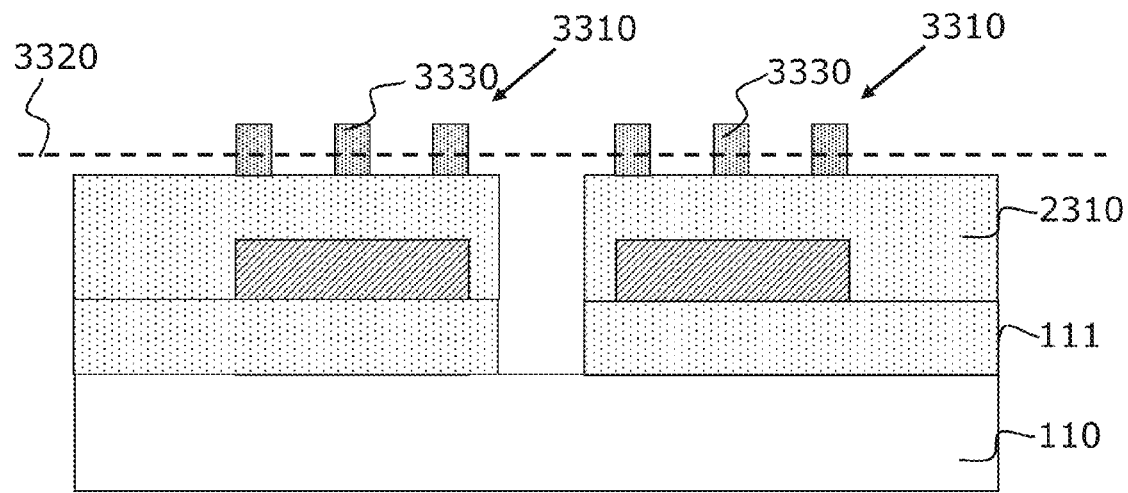
FIG. 33 shows a cross-sectional view after selectively etching the second semiconductor structures.

FIG. 33 shows a cross-sectional view of a structure 3300 after selectively etching the second semiconductor structures 3120. This has formed fin structures 3310 comprising a plurality of parallel fins 3330 of the first semiconductor structures 3110 in a second plane 3320.

Figure 34:
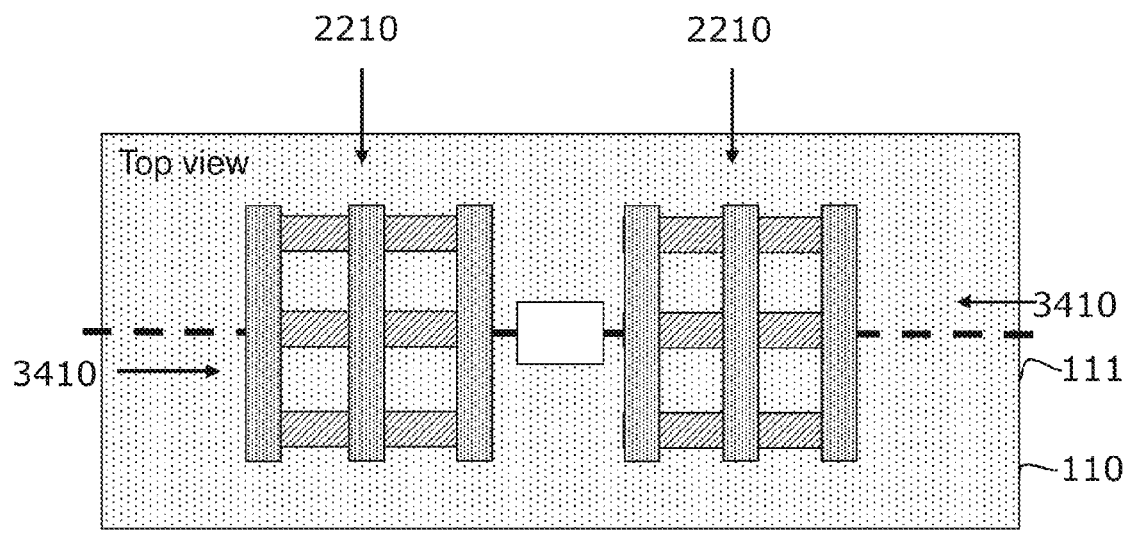
FIG. 34 shows a corresponding top view of the structure of FIG. 33.

FIG. 34 shows a corresponding top view of the structure 3300. More particularly, the structure 3300 is a cross section taken along the line A-A of FIG. 34.

As illustrated in FIG. 34, with the method as described with reference to FIGS. 20-34 the first fin arrays 2210 have been formed in the first plane 2120 and second fin arrays 3410 of the fins 3330 have been formed in the second plane 3320 above the first plane 2120. Thereby the 3-dimensional fin array structure 3400 has been formed.

FIGS. 35 and 36 illustrate another exemplary embodiments of a growth channel that is provided with geometrical constraints to reduce in plane crystalline defects.

FIG. 35 shows a cross-sectional view of a structure 3500 having lateral growth channels 136. In a plane extending laterally over the substrate 110, in plane defects 3510 have been propagated in the lateral growth channels 136. In addition, defects 3520 have been grown in the opening of the insulating layer 111, but as these have propagated vertically/outwardly to the surface of the substrate 110, they can be filtered out by the 90° curve between the opening 112 and the growth channels 136.

FIG. 36 shows a corresponding top view of the structure 3500. More particularly, the structure 3500 is a cross section taken along the line A-A of FIG. 35. As can be seen in FIG. 36, geometrical constraints 3610 have been provided. In this embodiment the geometrical constraints 3610 are in plane neckings of the growth channel 136. The in plane neckings 3610 provide an in plane seed for the further growth, thereby filtering out the in plane defects 3510. The structure 3600 comprises 2 compound semiconductor structures 3620 that may be subsequently used as starting structures to form semiconductor devices, e.g. FETs, on top of it. As an example, the compound semiconductor structures 3620 may be used as channel structures for subsequently formed FETs.

While illustrative examples are given above, it will be appreciated that the basic fabrication steps described above can be used to produce semiconductor structures of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the semiconductor structures may be preferably crystalline seed surfaces, but may according to other embodiments also be provided by amorphous surfaces. If the seed has a well-defined crystalline orientation and if the crystal structure of the seed is a reasonable match to that of the growing crystal (for example a III-V compound semiconductor), the growing crystal can adapt this orientation. If the seed is amorphous or has an undefined crystal orientation, the growing crystal will be single crystalline but its crystal orientation will be random.

By appropriate shaping of the sacrificial structure in fabrication processes embodying the invention, cavity structures and corresponding cavities can be formed with any desired shapes and cross-sectional dimensions. Furthermore, the cross-section may be varied along the length of the cavity structures if desired. For example, cavity structures can be formed with curves, bends, corners, junctions and branches.

The skilled artisan will appreciate that aspects of the invention contemplate a semiconductor structure obtainable by a method as described herein as well as a wafer comprising a plurality of semiconductor structures and/or circuits as described herein.

The disclosed semiconductor structures and circuits can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip may be integrated with other chips, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input devices, and a central processor.

Embodiments of the present invention described and illustrated herein have been dedicated to use in semiconductor devices such as integrated circuits. However, embodiments of the present invention are not limited as such. Other embodiments of the present invention contemplate a temperature measurement device that could be a "standalone" device, such as one that is placed on the skin of a human and used to take temperature measurements of the human. As such, this type of device may be a relatively inexpensive and high volume type of device which is used once and then discarded. Also, other embodiments of the present invention contemplate a temperature measurement device that may be integrated into a process control system for various types of industry, for example, some type of manufacturing process in which it is desired to measure the temperature of a part being manufactured and/or of the machines utilized in the manufacture of the parts.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor structure, the method comprising:
   providing a semiconductor substrate;
   forming an insulating layer on the semiconductor substrate;
   forming a cavity structure above the insulating layer, the cavity structure comprising a lateral growth channel and a fin seed structure arranged in the lateral growth channel, the fin seed structure providing a seed surface for growing a fin structure;
   growing sequentially in the growth channel from the seed surface in an alternating way one or more first semiconductor structures of a first semiconductor material and one or more second semiconductor structures of a second semiconductor material, the first semiconductor material being different from the second semiconductor material, wherein the first semiconductor structures provide a seed surface for the second semiconductor structures and the second semiconductor structures provide a seed surface for the first semiconductor structures;
   selectively etching the second semiconductor structures, thereby forming the fin structure comprising a plurality of parallel fins of the first semiconductor structures.

2. The method as claimed in claim 1, comprising:
   forming an opening in the insulating layer, the opening having sidewalls and a bottom, wherein the bottom corresponds to a seed surface of the substrate;
   growing the fin seed structure from the seed surface of the substrate.

3. The method as claimed in claim 2, wherein providing the fin seed structure comprises:
   growing a first matching structure on the seed surface of the substrate;
   growing a second matching structure on a seed surface of the first matching structure.

4. The method as claimed in claim 3, wherein the first and the second matching structure are adapted to solve a growth mismatch between the material of the substrate and the first and/or the second semiconductor material in a stepwise approach.

5. The method as claimed in claim 1, wherein the first semiconductor material is comprised of a group III-V compound material or a group II-VI compound material.

6. The method as claimed in claim 1, wherein the second semiconductor material is comprised of a group III-V compound material or a group II-VI compound material.

7. The method as claimed in claim 1, wherein the width of the first and the second semiconductor structure in the growth direction is controlled via the time of the epitaxial growth.

8. The method as claimed in claim 1, wherein the width in the growth direction of the first semiconductor structure is less than 10 nm.

9. The method as claimed in claim 1, wherein the width in the growth direction of the second semiconductor structure is between 10 nm and 30 nm.

10. The method as claimed in claim 1, wherein the length of the first and the second semiconductor structure in a direction perpendicular to the growth direction is between 1 um and 10 um.

11. The method as claimed in claim 1, wherein the width in the growth direction of the second semiconductor structure is at least two times greater than the width of the first semiconductor structure in the growth direction.

12. The method as claimed in claim 1, wherein the selective etching is performed by wet etching.

13. The method as claimed in claim 1, wherein the selective etching is performed by dry-etching.

14. The method as claimed in claim 1, wherein the etching comprises dry etching by one of: Inductive Coupled Plasma (ICP); Reactive Ion Etching (RIE) and Electron Cyclotron Resonance (ECR).

15. The method as claimed in claim 1, wherein the fins are further processed to form a Field Effect Transistor (FET) and wherein the fins establish a channel portion of the FET.

16. The method as claimed in claim 1, wherein the first and the second semiconductor material are selected from the pairs of: (InGaAs, InP) or (AlGaSb, GaSb).

17. The method as claimed in claim 1, wherein the growing of the first and the second semiconductor structures is performed by one of: metal organic chemical vapor deposition (MOCVD); atmospheric pressure CVD; low or reduced pressure CVD; ultra-high vacuum CVD; molecular beam epitaxy (MBE); atomic layer deposition (ALD) and hydride vapor phase epitaxy.

18. The method as claimed in claim 1, further comprising:
   growing a first array of fins in a first plane;
   growing a second array of fins in a second plane above the first plane, thereby fabricating a 3-dimensional fin array structure.

19. The method as claimed in claim 1, further comprising:
   fabricating a first array of fins in a first plane by standard lithography and etching;
   growing a second array of fins in a second plane above the first plane, thereby fabricating a 3-dimensional fin array structure.

20. The method as claimed in claim 1, further comprising doping the first semiconductor structures by in situ doping.

21. The method as claimed in claim 1, further comprising providing a geometrical constraint in the growth channel to reduce in plane crystalline defects.

22. The method as claimed in claim 21, wherein the geometrical constraint is an in plane necking of the growth channel.

23. The method as claimed in claim 21, wherein the geometrical constraint is a change of the in plane direction of the growth channel.

24. A semiconductor structure obtainable by a method as claimed in claim 1.

25. A wafer comprising a plurality of semiconductor structures as claimed in claim 24.

* * * * *